US011199696B2

(12) United States Patent
Kwon et al.

(10) Patent No.: US 11,199,696 B2
(45) Date of Patent: Dec. 14, 2021

(54) SEMICONDUCTOR DEVICE

(71) Applicant: Kabushiki Kaisha Toshiba, Minato-ku (JP)

(72) Inventors: Honam Kwon, Kawasaki (JP); Koichi Ishii, Kawasaki (JP); Ikuo Fujiwara, Yokohama (JP); Kazuhiro Suzuki, Meguro (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 239 days.

(21) Appl. No.: 16/552,207

(22) Filed: Aug. 27, 2019

(65) Prior Publication Data

US 2020/0301129 A1 Sep. 24, 2020

(30) Foreign Application Priority Data

Mar. 19, 2019 (JP) ............................ JP2019-051077

(51) Int. Cl.
*G02B 26/08* (2006.01)
*G02B 26/10* (2006.01)

(52) U.S. Cl.
CPC ..... *G02B 26/0858* (2013.01); *G02B 26/0866* (2013.01); *G02B 26/105* (2013.01)

(58) Field of Classification Search
None
See application file for complete search history.

(56) References Cited

U.S. PATENT DOCUMENTS 7,548,362 B2 * 6/2009 Miyagawa ........... G02B 26/105 359/224.1
2003/0168942 A1 9/2003 Iino et al.
2005/0035682 A1 2/2005 Tsuboi et al.
2005/0099665 A1 5/2005 Lee et al.
(Continued)

FOREIGN PATENT DOCUMENTS

JM 2007-312465 A 11/2007
JP 2003-117897 A 4/2003
(Continued)

OTHER PUBLICATIONS

Jain, A, et al. "A single-crystal silicon micromirror for large bi-directional 2D scanning applications," Sensors and Actuators A, vol. 130, pp. 454-460, 2006.

*Primary Examiner* — Jennifer D. Carruth
(74) *Attorney, Agent, or Firm* — Oblon, McClelland, Maier & Neustadt, L.L.P.

(57) ABSTRACT

According to an embodiment, a semiconductor device includes a first actuator, a second actuator, a first frame provided between the first actuator and the second actuator, a first connection member connecting the first actuator and the first frame to each other, a second connection member connecting the first actuator and the first frame to each other at a position different from a position at which the first connection member connects the first actuator and the first frame to each other, a third connection member connecting the second actuator and the first frame to each other, a fourth connection member connecting the second actuator and the first frame to each other at a position different from a position at which the third connection member connects the second actuator and the first frame to each other.

17 Claims, 7 Drawing Sheets

6 22 20 50 30 16 24 110
8 12
34 38
2 4
96 98
52 54
36 40
10 14
26 32 18 28
x y z

(56) References Cited

U.S. PATENT DOCUMENTS

| | | | | |
|---|---|---|---|---|
| 2009/0080049 | A1 | 3/2009 | Ko et al. | |
| 2010/0232833 | A1* | 9/2010 | Fujii | G02B 26/105<br>399/130 |

FOREIGN PATENT DOCUMENTS

| | | | |
|---|---|---|---|
| JP | 2005-141229 | A | 6/2005 |
| JP | 2006-296138 | A | 10/2006 |
| JP | 2009-75587 | A | 4/2009 |
| JP | 2010-197662 | | 9/2010 |
| JP | 2015-102709 | A | 6/2015 |

* cited by examiner

SEMICONDUCTOR DEVICE

CROSS-REFERENCE TO RELATED APPLICATION

This application is based upon and claims the benefit of priority from Japanese Patent Application No. 2019-051077, filed on Mar. 19, 2019, the entire contents of which are incorporated herein by reference.

FIELD

Embodiments described herein relate generally to a semiconductor device.

BACKGROUND

Micro electro mechanical systems (MEMS) which is a semiconductor device in which not only circuits but also microstructures, sensors, or mechanically-moving actuators are integrated can be formed by a microfabrication technology called as "micromachining", which is evolved from an integrated circuit technology. A high-performance actuator is required as an actuator to which the MEMS technology is applied.

DETAILED DESCRIPTION

Figure 1A:
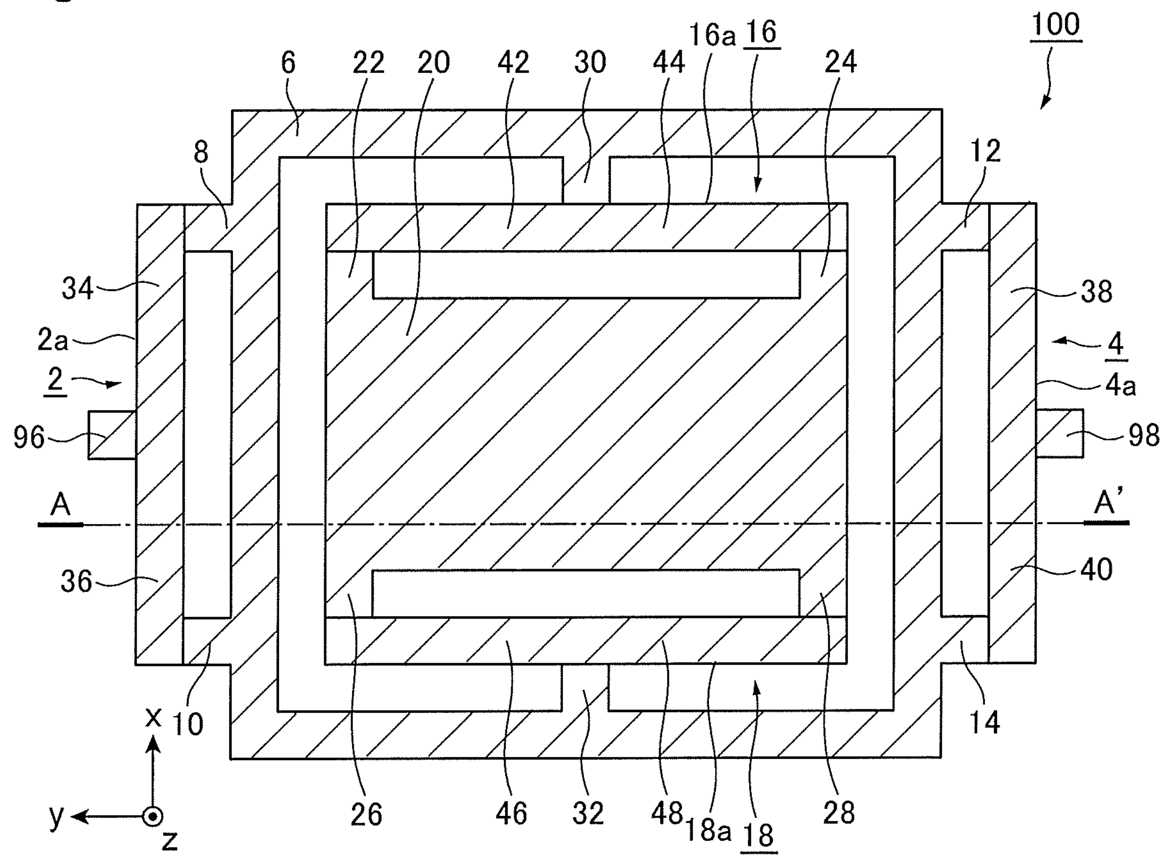
FIGS. 1A to 1D are schematic diagrams illustrating a semiconductor device according to a first embodiment.

According to an embodiment, a semiconductor device includes a first actuator, a second actuator, a first frame provided between the first actuator and the second actuator, a first connection member connecting the first actuator and the first frame to each other, a second connection member connecting the first actuator and the first frame to each other at a position different from a position at which the first connection member connects the first actuator and the first frame to each other, a third connection member connecting the second actuator and the first frame to each other, a fourth connection member connecting the second actuator and the first frame to each other at a position different from a position at which the third connection member connects the second actuator and the first frame to each other, a third actuator provided on an inside of the first frame, a fourth actuator provided on the inside of the first frame, a stage provided between the third actuator and the fourth actuator, a fifth connection member connecting the third actuator and the stage to each other, a sixth connection member connecting the third actuator and the stage to each other at a position different from a position at which the fifth connection member connects the third actuator and the stage to each other, a seventh connection member connecting the fourth actuator and the stage to each other, an eighth connection member connecting the fourth actuator and the stage to each other at a position different from a position at which the seventh connection member connects the fourth actuator and the stage to each other, a ninth connection member connecting the third actuator and the first frame to each other, and a tenth connection member connecting the fourth actuator and the first frame to each other.

Hereinafter, embodiments will be described with reference to the drawings. In the drawings, the same or similar parts are denoted by the same or similar reference signs.

First Embodiment

FIGS. 1A to 1D are schematic diagrams illustrating a semiconductor device 100 according to a first embodiment.

FIG. 1A is a top view schematically illustrating the semiconductor device 100 in the embodiment.

In the embodiment, the semiconductor device 100 is a scanner (optical scanner) formed by a MEMS technology.

The optical scanner is used, for example, for scanning with light such as laser light.

Here, an x-axis, a y-axis intersecting the x-axis, and a z-axis intersecting the x-axis and the y-axis are defined. In the embodiment, the term "intersecting" means "substantially intersecting". An x-direction being a direction parallel to the x-axis is an example of a first direction. A y-direction being a direction parallel to the y-axis is an example of a second direction. A z-direction being a direction parallel to the z-axis is an example of a third direction.

A first actuator 2 has a rectangular shape and a long side 2*a* disposed to be parallel to the x-direction. As described later, a stage 20 is capable of pivoting on the y-axis by the first actuator 2.

A second actuator 4 has a rectangular shape and a long side 4*a* disposed to be parallel to the x-direction. As described later, the stage 20 is capable of pivoting on the y-axis by the second actuator 4.

The first actuator 2 is connected to a thirteenth connection member 96. The second actuator 4 is connected to a fourteenth connection member 98. For example, the thirteenth connection member 96 and the fourteenth connection member 98 are connected to a substrate such as a silicon (Si) substrate, which is not illustrated in FIGS. 1A to 1D. The semiconductor device 100 is supported on the substrate (not illustrated in FIGS. 1A to 1D). Preferably, the thirteenth connection member 96 is provided in the vicinity of the middle of one end and the other end of the first actuator 2, to be adjacent to the first actuator 2. Preferably, the fourteenth connection member 98 is provided in the vicinity of the middle of one end and the other end of the second actuator 4, to be adjacent to the second actuator 4.

A first frame 6 is provided between the first actuator 2 and the second actuator 4. The first frame 6 is a frame-like member which is provided parallel to an xy plane and has a rectangular shape, for example. If the first frame 6 is provided parallel to the xy plane, a simple structure is obtained. Thus, this is preferable. One side of the first frame 6 is provided parallel to the x-axis, for example. Another side of the first frame 6 is provided parallel to the y-axis. The shape and the disposition of the first frame 6 are not limited to the embodiment.

A first connection member 8 connects the first actuator 2 and the first frame 6 to each other. A second connection member 10 connects the first actuator 2 and the first frame 6 to each other at a position different from the position at which the first connection member 8 connects the first actuator 2 and the first frame 6 to each other. More specifically, one side of the first frame 6, which is illustrated on the left side in FIGS. 1A and 1*s* parallel to the x-axis, is connected to one end of the first actuator 2 by the first connection member 8 and is connected to the other end of the first actuator 2 by the second connection member 10. Such connections allow a motion range of the scanner to increase, and thus are preferable.

Preferably, the first connection member 8 and the second connection member 10 are provided to be symmetrical with each other with respect to a plane parallel to a yz plane passing through the center of the thirteenth connection member 96. In this case, the first connection member 8 may not be connected to the one end of the first actuator 2, and the second connection member 10 may not be connected to the other end of the first actuator 2.

A third connection member 12 connects the second actuator 4 and the first frame 6 to each other. A fourth connection member 14 connects the second actuator 4 and the first frame 6 to each other at a position different from the position at which the third connection member 12 connects the second actuator 4 and the first frame 6 to each other. More specifically, one side of the first frame 6, which is illustrated on the right side in FIGS. 1A and 1*s* parallel to the x-axis, is connected to one end of the second actuator 4 by the third connection member 12 and is connected to the other end of the second actuator 4 by the fourth connection member 14. Such connections allow a motion range of the scanner to increase, and thus are preferable.

Preferably, the third connection member 12 and the fourth connection member 14 are provided to be symmetrical with each other with respect to a plane parallel to the yz plane passing through the center of the fourteenth connection member 98. In this case, the third connection member 12 may not be connected to the one end of the second actuator 4, and the fourth connection member 14 may not be connected to the other end of the second actuator 4.

A third actuator 16 is provided on the inside of the first frame 6. The third actuator 16 has a rectangular shape and a long side 16*a* disposed to be parallel to the y-direction. As described later, the stage 20 is capable of pivoting on the x-axis by the third actuator 16.

A fourth actuator 18 is provided on the inside of the first frame 6. The fourth actuator 18 has a rectangular shape and a long side 18*a* disposed to be parallel to the y-direction. As described later, the stage 20 is capable of pivoting on the x-axis by the fourth actuator 18.

The stage 20 is provided between the third actuator 16 and the fourth actuator 18. The stage 20 includes, for example, a light reflector (mirror) 94 described later, and a device such as a vertical cavity surface emitting laser (VCSEL). A surface 20*a* of the stage 20 is parallel to the xy plane, for example.

A fifth connection member 22 connects the third actuator 16 and the stage 20 to each other. A sixth connection member 24 connects the third actuator 16 and the stage 20 to each other at a position different from the position at which the fifth connection member 22 connects the third actuator 16 and the stage 20 to each other. More specifically, preferably, the stage 20 is connected to one end of the third actuator 16 by the fifth connection member 22 and is connected to the other end of the third actuator 16 by the sixth connection member 24.

A seventh connection member 26 connects the fourth actuator 18 and the stage 20 to each other. An eighth connection member 28 connects the fourth actuator 18 and the stage 20 to each other at a position different from the position at which the seventh connection member 26 connects the fourth actuator 18 and the stage 20 to each other. More specifically, the stage 20 is connected to one end of the fourth actuator 18 by the seventh connection member 26 and is connected to the other end of the fourth actuator 18 by the eighth connection member 28.

A ninth connection member 30 connects the third actuator 16 and the first frame 6 to each other.

Preferably, the ninth connection member 30 is provided in the vicinity of the middle of one end and the other end of the third actuator 16, to be adjacent to the third actuator 16, and connects the third actuator 16 and the first frame 6 to each other.

Preferably, the fifth connection member 22 and the sixth connection member 24 are provided to be symmetrical with each other with respect to a plane parallel to an xz plane passing through the center of the ninth connection member 30. In this case, the fifth connection member 22 may not be connected to the one end of the third actuator 16, and the sixth connection member 24 may not be connected to the other end of the third actuator 16.

A tenth connection member 32 connects the fourth actuator 18 and the first frame 6 to each other.

Preferably, the tenth connection member 32 is provided in the vicinity of the middle of one end and the other end of the fourth actuator 18, to be adjacent to the fourth actuator 18, and connects the fourth actuator 18 and the first frame 6 to each other.

Preferably, the seventh connection member 26 and the eighth connection member 28 are provided to be symmetrical with each other with respect to a plane parallel to the xz plane passing through the center of the tenth connection member 32. In this case, the seventh connection member 26 may not be connected to the one end of the fourth actuator 18, and the eighth connection member 28 may not be connected to the other end of the fourth actuator 18.

The term "symmetry" described in this specification may not have a meaning of completely corresponding to each other and may have a meaning of being shifted from each other by the degree of a manufacturing error.

Figure 1B:
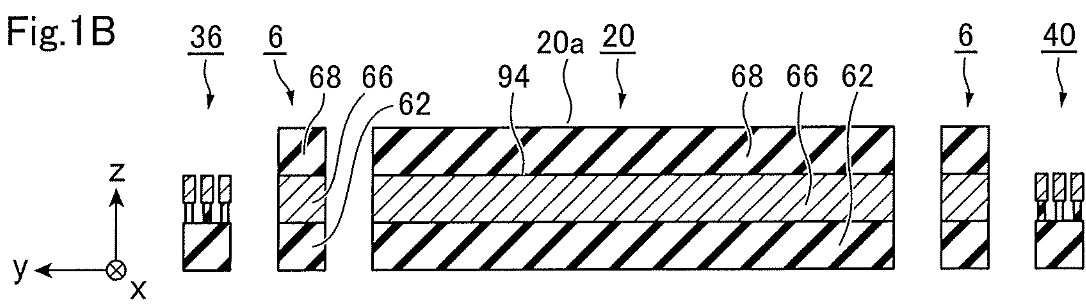
Figure 1C:
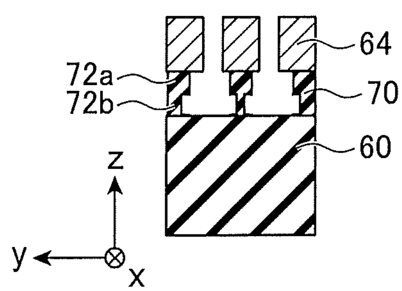
Figure 1D:
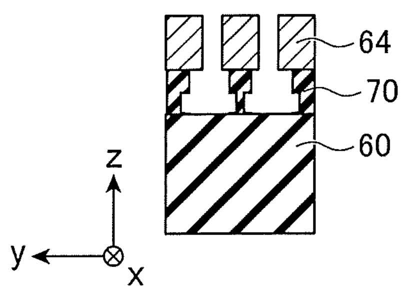

FIG. 1B is a sectional view schematically illustrating the semiconductor device 100 in the embodiment, in a section of A-A' in FIG. 1A. FIGS. 1C and 1D are sectional views illustrating enlarged sections of a sixth actuator 36 and an eighth actuator 40 in FIG. 1B.

Figure 2A:
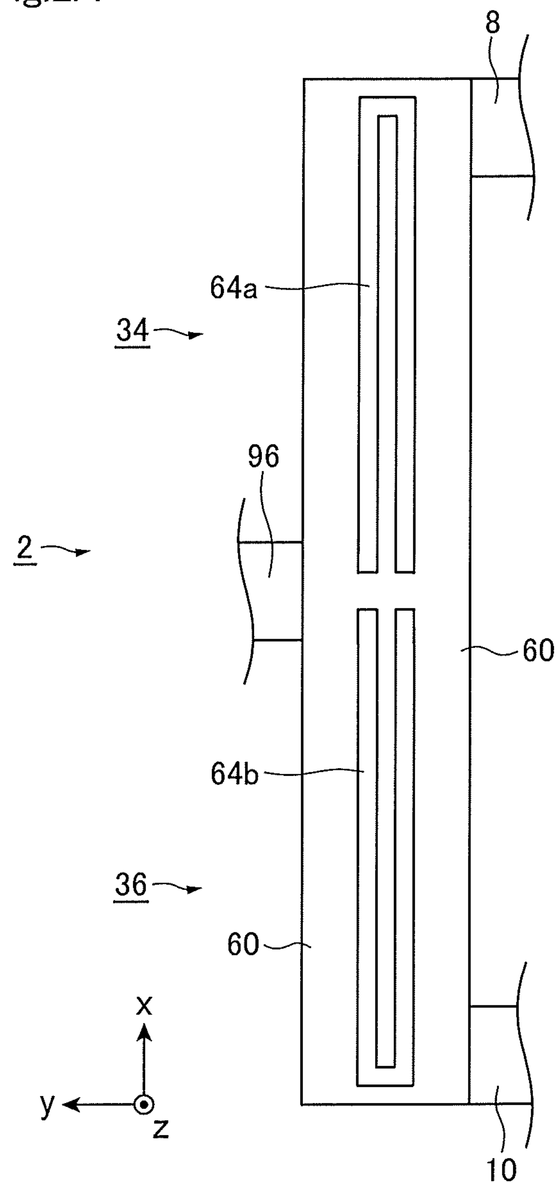
FIGS. 2A and 2B are top views schematically illustrating an actuator and surroundings of the actuator in the semiconductor device in the first embodiment.
Figure 2B:
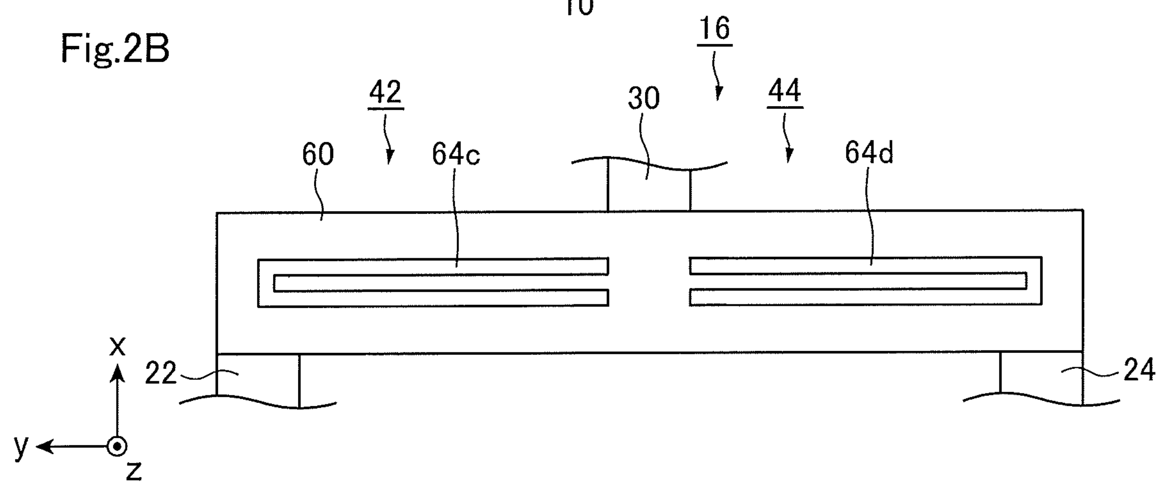

FIGS. 2A and 2B are top views schematically illustrating the actuator and the surroundings of the actuator in the semiconductor device 100 in the embodiment. FIG. 2A is a top view schematically illustrating the structure of the first actuator 2 and the surroundings. FIG. 2B is a top view schematically illustrating the structure of the third actuator 16 and the surroundings.

The structure of the actuator in the embodiment will be described with reference to FIGS. 1B to 1D, 2A, and 2B.

The first actuator 2 includes a fifth actuator 34 and the sixth actuator 36 which are provided to be adjacent to each other in the x-direction. The fifth actuator 34 is provided on the upper side of FIG. 1A. The sixth actuator 36 is provided on the lower side of FIG. 1A. For example, the fifth actuator

34 is provided between the thirteenth connection member 96 and the first connection member 8. The sixth actuator 36 is provided between the thirteenth connection member 96 and the second connection member 10.

For example, as illustrated in FIG. 2A, the fifth actuator 34 includes a first metal layer 64*a* having a shape meandering in a plane parallel to the xy plane. The first metal layer 64*a* has a portion parallel to the x-direction. The portion of the first metal layer 64*a*, which is parallel to the x-direction, is longer than the length of a portion of the first metal layer 64*a*, which is parallel to the y-direction. The sixth actuator 36 includes a first metal layer 64*b*. The first metal layer 64*b* has a shape meandering in a plane parallel to the xy plane and is not electrically connected to the first metal layer 64*a*. The first metal layer 64*b* has a portion parallel to the x-direction. The portion of the first metal layer 64*b*, which is parallel to the x-direction, is longer than the length of a portion of the first metal layer 64*b*, which is parallel to the y-direction.

For example, as illustrated in FIG. 1C, in the section of A-A' in FIG. 1A, the sixth actuator 36 includes a first oxide layer 60, a fourth oxide layer 70, and a first metal layer 64 which are sequentially stacked in the z-direction. In other words, the fourth oxide layer 70 is provided between the first oxide layer 60 and the first metal layer 64. The width of the fourth oxide layer 70 is narrower than the width of the first oxide layer 60. The section of the fifth actuator 34 also has a similar shape. Therefore, descriptions of the shape of the section of the fifth actuator 34 will not be repeated.

For example, a wiring (not illustrated) is connected to the first metal layer 64*a*. For example, a wiring (not illustrated) different from the wiring connected to the first metal layer 64*a* is connected to the first metal layer 64*b*.

A case where a current flows in the first metal layer 64*b* by using the above-described not-illustrated wiring is considered. At this time, heat is generated by Joule heat in the first metal layer 64*b*. Here, as described above, the first metal layer 64*b* has a portion having a length in the x-direction, which is longer than a length in the y-direction. Therefore, the degree of thermal expansion by heat generation is larger in the x-direction larger than in the y-direction. The reason of the meandering shape is that an increase of resistance of a current flowing in the first metal layer 64*b* is desired in order to increase heat generated by Joule heat.

The degree of thermal expansion of the first oxide layer 60 by heat generation is smaller than the degree of thermal expansion of the first metal layer 64*b*. Therefore, a portion of the sixth actuator 36, which is adjacent to the second connection member 10 in FIG. 1A, deforms to the back side of FIG. 1A by the heat generation. Thus, a portion of the first frame 6, which is connected to the second connection member 10, deforms to the back side of FIG. 1A. Thus, the tenth connection member 32, the fourth actuator 18, and the seventh connection member 26 deform. As a result, the lower left portion of the stage 20 in FIG. 1A deforms to the back side of FIG. 1A. As described later, the stage 20 is capable of pivoting on the y-axis by the sixth actuator 36. If the current does not flow in the first metal layer 64*b*, heat generation is suspended, and thus the shape is restored to the original shape.

Next, a case where a current flows in the first metal layer 64*a* is considered. At this time, heat is generated by Joule heat in the first metal layer 64*a*. Here, as described above, the first metal layer 64*a* has a portion having a length in the x-direction, which is longer than a length in the y-direction. Therefore, the degree of thermal expansion by heat generation is larger in the x-direction larger than in the y-direction.

The degree of thermal expansion of the first oxide layer 60 by heat generation is smaller than the degree of thermal expansion of the first metal layer 64*a*. Therefore, a portion of the fifth actuator 34, which is adjacent to the first connection member 8 in FIG. 1A, deforms to the back side of FIG. 1A by the heat generation. Thus, a portion of the first frame 6, which is connected to the first connection member 8, deforms to the back side of FIG. 1A. Thus, the ninth connection member 30, the third actuator 16, and the fifth connection member 22 deform. As a result, the upper left portion of the stage 20 in FIG. 1A deforms to the back side of FIG. 1A. As described later, the stage 20 is capable of pivoting on the y-axis by the fifth actuator 34. If the current does not flow in the first metal layer 64*a*, heat generation is suspended, and thus the shape is restored to the original shape.

The second actuator 4 includes a seventh actuator 38 and the eighth actuator 40 which are provided to be adjacent to each other in the x-direction. The seventh actuator 38 is provided on the upper side of FIG. 1A. The eighth actuator 40 is provided on the lower side of FIG. 1A. For example, the seventh actuator 38 is provided between the fourteenth connection member 98 and the third connection member 12. The eighth actuator 40 is provided between the fourteenth connection member 98 and the fourth connection member 14.

For example, the shape of the seventh actuator 38 is similar to the shape of the fifth actuator 34. The shape of the eighth actuator 40 is similar to the shape of the sixth actuator 36.

A case where a current flows in a first metal layer 64 of the seventh actuator 38 by using a wiring (not illustrated) connected to the first metal layer 64 of the seventh actuator 38 is considered. At this time, heat is generated by Joule heat in the first metal layer 64. Here, as described above, the first metal layer 64 has a portion having a length in the x-direction, which is longer than a length in the y-direction. Therefore, the degree of thermal expansion by heat generation is larger in the x-direction larger than in the y-direction.

The degree of thermal expansion of the first oxide layer 60 by heat generation is smaller than the degree of thermal expansion of the first metal layer 64. Therefore, a portion of the seventh actuator 38, which is adjacent to the third connection member 12 in FIG. 1A, deforms to the back side of FIG. 1A by the heat generation. Thus, a portion of the first frame 6, which is connected to the third connection member 12, deforms to the back side of FIG. 1A. Thus, the ninth connection member 30, the third actuator 16, and the sixth connection member 24 deform. As a result, the upper right portion of the stage 20 in FIG. 1A deforms to the back side of FIG. 1A. As described later, the stage 20 is capable of pivoting on the y-axis by the seventh actuator 38. If the current does not flow in the first metal layer 64, heat generation is suspended, and thus the shape is restored to the original shape.

Next, a case where a current flows in a first metal layer 64 of the eighth actuator 40 by using a wiring (not illustrated) connected to the first metal layer 64 of the eighth actuator 40 is considered. At this time, heat is generated by Joule heat in the first metal layer 64. Here, as described above, the first metal layer 64 has a portion having a length in the x-direction, which is longer than a length in the y-direction. Therefore, the degree of thermal expansion by heat generation is larger in the x-direction larger than in the y-direction.

The degree of thermal expansion of the first oxide layer 60 by heat generation is smaller than the degree of thermal expansion of the first metal layer 64. Therefore, a portion of the eighth actuator 40, which is adjacent to the fourth connection member 14 in FIG. 1A, deforms to the back side of FIG. 1A by the heat generation. Thus, a portion of the first frame 6, which is connected to the fourth connection member 14, deforms to the back side of FIG. 1A. Thus, the tenth connection member 32, the fourth actuator 18, and the eighth connection member 28 deform. As a result, the lower right portion of the stage 20 in FIG. 1A deforms to the back side of FIG. 1A. As described later, the stage 20 is capable of pivoting on the y-axis by the eighth actuator 40. If the current does not flow in the first metal layer 64, heat generation is suspended, and thus the shape is restored to the original shape.

The third actuator 16 includes a ninth actuator 42 and a tenth actuator 44 which are provided to be adjacent to each other in the y-direction. The ninth actuator 42 is provided on the left side of FIG. 1A. The tenth actuator 44 is provided on the right side of FIG. 1A. For example, the ninth actuator 42 is provided between the ninth connection member 30 and the fifth connection member 22. The tenth actuator 44 is provided between the ninth connection member 30 and the sixth connection member 24.

For example, as illustrated in FIG. 2B, the ninth actuator 42 includes a first metal layer 64*c* having a shape meandering in a plane parallel to the xy plane. The first metal layer 64*c* has a portion parallel to the y-direction. The portion of the first metal layer 64*c*, which is parallel to the y-direction, is longer than the length of a portion of the first metal layer 64*c*, which is parallel to the x-direction. The tenth actuator 44 includes a first metal layer 64*d*. The first metal layer 64*d* has a shape meandering in a plane parallel to the xy plane and is not electrically connected to the first metal layer 64*c*. The first metal layer 64*d* has a portion parallel to the y-direction. The portion of the first metal layer 64*d*, which is parallel to the y-direction, is longer than the length of a portion of the first metal layer 64*d*, which is parallel to the x-direction. The sectional structure of the ninth actuator 42 and the sectional structure of the tenth actuator 44 are similar to the sectional structures of the fifth actuator 34, the sixth actuator 36, the seventh actuator 38, and the eighth actuator 40, and thus descriptions will not be repeated.

For example, a wiring (not illustrated) is connected to the first metal layer 64*c*. For example, a wiring (not illustrated) different from the wiring connected to the first metal layer 64*c* is connected to the first metal layer 64*d*.

A case where a current flows in the first metal layer 64*c* by using the above-described not-illustrated wiring is considered. At this time, heat is generated by Joule heat in the first metal layer 64*c*. Here, as described above, the first metal layer 64*c* has a portion having a length in the y-direction, which is longer than a length in the x-direction. Therefore, the degree of thermal expansion by heat generation is larger in the y-direction larger than in the x-direction.

The degree of thermal expansion of the first oxide layer 60 by heat generation is smaller than the degree of thermal expansion of the first metal layer 64*c*. Therefore, a portion of the ninth actuator 42, which is adjacent to the fifth connection member 22 in FIG. 1A, deforms to the back side of FIG. 1A by the heat generation. As a result, the upper left portion of the stage 20 in FIG. 1A deforms to the back side of FIG. 1A. As described later, the stage 20 is capable of pivoting on the x-axis by the ninth actuator 42. If the current does not flow in the first metal layer 64*c*, heat generation is suspended, and thus the shape is restored to the original shape.

Next, a case where a current flows in the first metal layer 64*d* is considered. At this time, heat is generated by Joule heat in the first metal layer 64*d*. Here, as described above, the first metal layer 64*d* has a portion having a length in the y-direction, which is longer than a length in the x-direction. Therefore, the degree of thermal expansion by heat generation is larger in the y-direction larger than in the x-direction.

The degree of thermal expansion of the first oxide layer 60 by heat generation is smaller than the degree of thermal expansion of the first metal layer 64*d*. Therefore, a portion of the tenth actuator 44, which is adjacent to the sixth connection member 24 in FIG. 1A, deforms to the back side of FIG. 1A by the heat generation. As a result, the upper right portion of the stage 20 in FIG. 1A deforms to the back side of FIG. 1A. As described later, the stage 20 is capable of pivoting on the x-axis by the tenth actuator 44. If the current does not flow in the first metal layer 64*d*, heat generation is suspended, and thus the shape is restored to the original shape.

The fourth actuator 18 includes an eleventh actuator 46 and the twelfth actuator 48 which are provided to be adjacent to each other in the y-direction. The eleventh actuator 46 is provided on the left side of FIG. 1A. The twelfth actuator 48 is provided on the right side of FIG. 1A. For example, the eleventh actuator 46 is provided between the tenth connection member 32 and the seventh connection member 26. The twelfth actuator 48 is provided between the tenth connection member 32 and the eighth connection member 28.

For example, the shape of the eleventh actuator 46 is similar to the shape of the ninth actuator 42. The shape of the twelfth actuator 48 is similar to the shape of the tenth actuator 44.

A case where a current flows in a first metal layer 64 of the eleventh actuator 46 by using a wiring (not illustrated) connected to the first metal layer 64 of the eleventh actuator is considered. At this time, heat is generated by Joule heat in the first metal layer 64. Here, as described above, the first metal layer 64 has a portion having a length in the y-direction, which is longer than a length in the x-direction. Therefore, the degree of thermal expansion by heat generation is larger in the y-direction larger than in the x-direction.

The degree of thermal expansion of the first oxide layer 60 by heat generation is smaller than the degree of thermal expansion of the first metal layer 64. Therefore, a portion of the eleventh actuator 46, which is adjacent to the seventh connection member 26 in FIG. 1A, deforms to the back side of FIG. 1A by the heat generation. As a result, the lower left portion of the stage 20 in FIG. 1A deforms to the back side of FIG. 1A. As described later, the stage 20 is capable of pivoting on the x-axis by the eleventh actuator 46. If the current does not flow in the first metal layer 64, heat generation is suspended, and thus the shape is restored to the original shape.

Next, a case where a current flows in a first metal layer 64 of the twelfth actuator 48 by using a wiring (not illustrated) connected to the first metal layer 64 of the twelfth actuator 48 is considered. At this time, heat is generated by Joule heat in the first metal layer 64. Here, as described above, the first metal layer 64 has a portion having a length in the y-direction, which is longer than a length in the x-direction. Therefore, the degree of thermal expansion by heat generation is larger in the y-direction larger than in the x-direction.

The degree of thermal expansion of the first oxide layer 60 by heat generation is smaller than the degree of thermal expansion of the first metal layer 64. Therefore, a portion of the twelfth actuator 48, which is adjacent to the eighth connection member 28 in FIG. 1A, deforms to the back side of FIG. 1A by the heat generation. As a result, the lower right portion of the stage 20 in FIG. 1A deforms to the back side of FIG. 1A. As described later, the stage 20 is capable of pivoting on the x-axis by the twelfth actuator 48. If the current does not flow in the first metal layer 64, heat generation is suspended, and thus the shape is restored to the original shape.

Preferably, a plurality of first metal layers 64 is provided in sections of the first actuator 2 (fifth actuator 34 and sixth actuator 36) and the second actuator (seventh actuator 38 and eighth actuator 40), which are parallel to the yz plane. Preferably, the plurality of first metal layers 64 is stacked on the first oxide layer 60, with being arranged in the y-direction. The fourth oxide layer 70 is preferably provided between each of the plurality of first metal layers 64 and the first oxide layer 60. Preferably, the fourth oxide layer 70 has a first portion 72*a* and a second portion 72*b*. The second portion 72*b* is provided between the first portion 72*a* and the first oxide layer 60 and has a width narrower than the width of the first portion 72*a* in the y-direction. For example, the widths of the first portion 72*a* and the first oxide layer 60 in the y-direction may be equal to each other. For example, the width of the first portion 72*a* in the y-direction may be narrower than the width of the first oxide layer 60 in the y-direction. The above descriptions are similarly applied to the third actuator 16 (ninth actuator 42 and tenth actuator 44) and the fourth actuator (eleventh actuator 46 and twelfth actuator 48).

As illustrated in FIG. 1B, each of the first frame 6 and the stage 20 includes a second oxide layer 62, a second metal layer 66, and a third oxide layer 68 which are sequentially stacked in the z-direction. In other words, the second metal layer 66 is interposed between the second oxide layer 62 and the third oxide layer 68. Therefore, even though there is an attempt of the second metal layer 66 expanding by heat generation, the second metal layer 66 is fixed by the second oxide layer 62 and the third oxide layer 68, and thus expansion is difficult. Similarly, the first connection member 8, the second connection member 10, the third connection member 12, the fourth connection member 14, the fifth connection member 22, the sixth connection member 24, the seventh connection member 26, the eighth connection member 28, the ninth connection member 30, and the tenth connection member 32 have the similar stacked structure (second oxide layer 62, second metal layer 66, and the third oxide layer 68), and thus have difficulty in expanding by heat generation.

As a result, only the actuator deforms largely by applying heat, and thus the stage 20 deforms.

In other words, in the embodiment, the semiconductor device 100 includes the first actuator 2, the second actuator 4, the first frame 6 provided between the first actuator 2 and the second actuator 4, the third actuator 16 provided on the inside of the first frame 6, the fourth actuator 18 provided on the inside of the first frame 6, and the stage 20 provided between the third actuator 16 and the fourth actuator 18. The stage 20 pivots by heat generated from the first actuator 2, the second actuator 4, the third actuator 16, or the fourth actuator 18, and a portion of the generated heat is transferred into the first frame 6. The portion of the generated heat, which has been transferred into the first frame 6 is transferred into the first actuator 2, the second actuator 4, the third actuator 16, or the fourth actuator 18 in which heat is not generated.

As described above, regarding the shape of the second metal layer 66, control of expansion and contraction by thermal expansion is not required. Therefore, for easy manufacturing, the second metal layer 66 may have a simple layer shape as illustrated in FIG. 1B, which is different from the shape of the first metal layer 64 used in the actuator. The shape of the second metal layer 66 is not limited to the embodiment.

The first oxide layer 60, the second oxide layer 62, the third oxide layer 68, and the fourth oxide layer 70 contain $SiO_x$ (silicon oxides), for example. In particular, in a case of using a Si substrate as a substrate 90, $SiO_x$ is preferable because $SiO_x$ can be easily formed by oxidizing a portion of the substrate 90.

The first metal layer 64 and the second metal layer 66 preferably contains Ag (silver), Cu (copper), Al (aluminum), and the like because of easy forming. In particular, in a case of containing Al, it is easy to form a metal layer of Al on a Si substrate as the substrate 90. Thus, this case is preferable.

For example, in a case where the second metal layer 66 contains Al and the like, light such as laser light is reflected by the second metal layer 66. Therefore, the second metal layer 66 can be used as the light reflector (mirror) 94. For example, another light reflector may be formed on the stage 20.

FIGS. 3A to 3E are sectional views schematically illustrating the semiconductor device in the middle of being manufactured, in a method of manufacturing the semiconductor device in the embodiment. An example using a Si substrate as the substrate 90 will be described below.

Figure 3A:
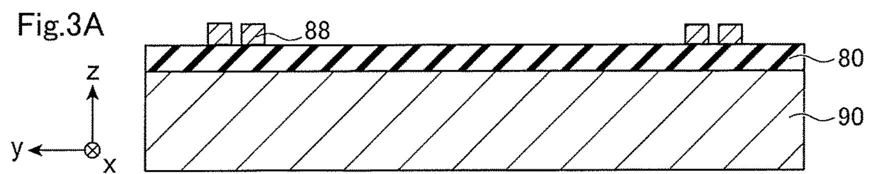
FIGS. 3A to 3E are sectional views schematically illustrating the semiconductor device in the middle of being manufactured, in a method of manufacturing the semiconductor device in the first embodiment.

Firstly, an oxide layer 80 containing $SiO_x$ is formed on the substrate 90 by a local oxidation of silicon (LOCOS) method, for example. Then, for example, a stopper 88 containing polysilicon is formed on a portion of the oxide layer 80 (FIG. 3A). The stopper 88 is formed at a portion corresponding to the actuator in the semiconductor device 100.

Figure 3B:
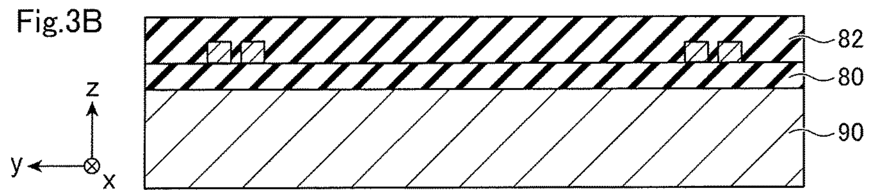

An oxide layer 82 being, for example, a tetraethoxysilane (TEOS) film or a borophosphosilicate glass (BPSG) film is formed on the oxide layer 80 and the stopper 88 (FIG. 3B). The oxide layer 80 and the oxide layer 82 constitute the first oxide layer 60, the second oxide layer 62, and the fourth oxide layer 70 in the semiconductor device 100.

Figure 3C:
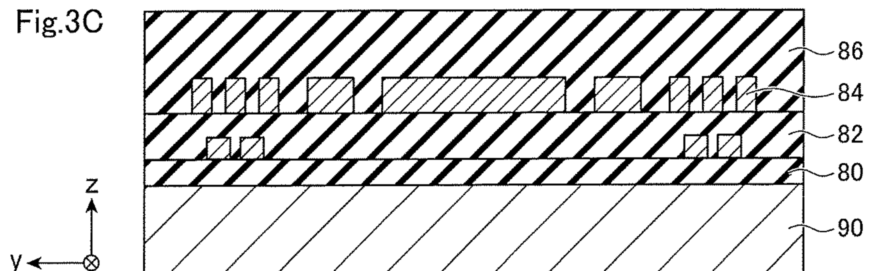

Then, a metal layer 84 containing, for example, Al is formed on a portion of the oxide layer 82. The metal layer 84 is a metal layer to become the first metal layer 64 and the second metal layer 66. Then, an oxide layer 86 being, for example, a TEOS film is formed on the oxide layer 82 and the metal layer 84. The surface of the oxide layer 86 is flattened, for example, by chemical mechanical polishing (CMP) (FIG. 3C). The oxide layer 86 constitutes the third oxide layer 68 in the semiconductor device 100.

Figure 3D:
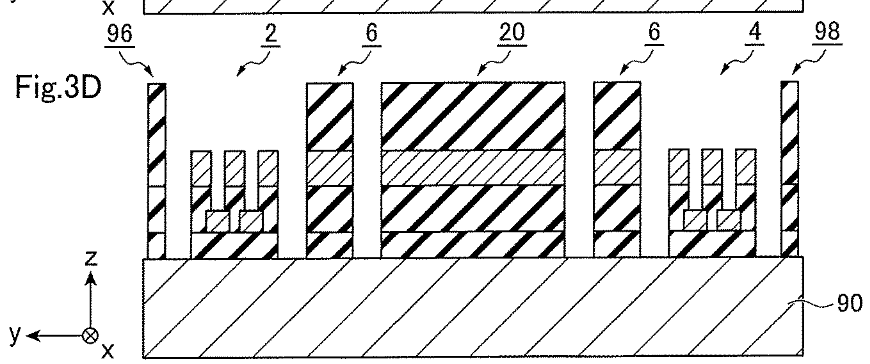

Then, portions of the oxide layer 80, the oxide layer 82, and the oxide layer 86 are removed, for example, by etching (FIG. 3D). Thus, the connection members (first connection member 8, second connection member 10, third connection member 12, fourth connection member 14, fifth connection member 22, sixth connection member 24, seventh connection member 26, eighth connection member 28, ninth connection member 30, and tenth connection member 32), the first frame 6, the stage 20, the thirteenth connection member 96, and the fourteenth connection member 98 are formed. The stopper 88 is provided at the portion corresponding to the actuator. Therefore, the oxide layer 80 disposed under the stopper 88 is not removed.

Figure 3E:
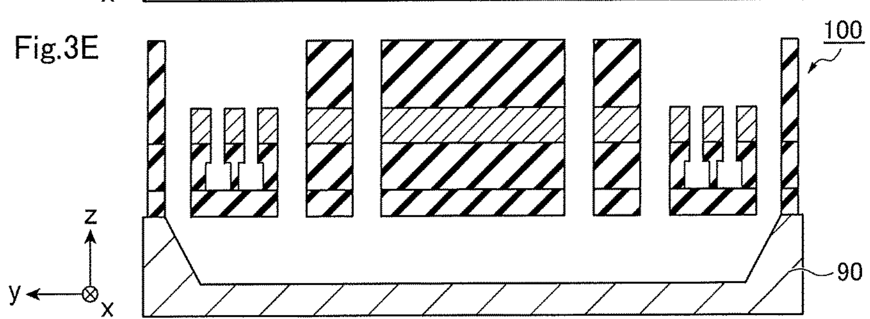

Then, the stopper 88 and a portion of the substrate 90 located under portions constituting the semiconductor device 100 are collectively removed, for example, by wet etching (FIG. 3E). Thus, the actuators (first actuator 2, second actuator 4, third actuator 16, and fourth actuator 18) are formed. Here, in a case where the substrate 90 is a Si substrate, and the stopper 88 contains polysilicon, both the substrate 90 and the stopper 88 have the same material. Thus, it is possible to remove the substrate 90 and the stopper 88 in the similar process. In this manner, the semiconductor device 100 in the embodiment is obtained.

Next, effects of the semiconductor device 100 in the embodiment will be described.

With the semiconductor device in the embodiment, it is possible to provide a high-performance semiconductor device.

A vacuum space required for an electrostatic actuator or a magnet required for an electromagnetic actuator may not be used in a scanner using a thermal actuator. Thus, it is possible to reduce the size of the scanner.

Since heat conduction in the scanner takes time, securing an operation speed of the scanner may act as a problem. However, the scanner manufactured by the MEMS technology is naturally small. Thus, heat is conducted in the scanner in a short time. Therefore, the problem in the operation speed occurs less frequently.

In a case using the thermal actuator in the scanner, a method of performing thermal separation in the scanner becomes a problem. Here, thermal separation means a method of conducting heat to a place to which heat is desired to be conducted in the scanner and of suppressing heat conduction to a place to which conduction of heat is not desired.

In the embodiment, the semiconductor device 100 includes the first frame 6. Therefore, thermal separation between heat applied to the actuator for driving around the x-axis and heat applied to the actuator for driving around the y-axis is performed well. Further, it is possible to keep balance between the heat applied to the actuator for driving around the x-axis and the heat applied to the actuator for driving around the y-axis. Therefore, it is possible to provide a semiconductor device (scanner) having a relatively simple structure, high controllability, and high performance.

The first actuator 2 and the first frame 6 are connected to each other by the first connection member 8. The first actuator 2 and the first frame 6 are connected to each other by the second connection member 10 at a position different from the position at which the first connection member 8 connects the first actuator 2 and the first frame 6 to each other. Therefore, heat generated from the first actuator 2 is more evenly held by the first frame 6 in comparison to a case where the first actuator 2 and the first frame 6 are connected to each other at one position. As a result, a situation in which extra heat is transferred into the third actuator 16 and the fourth actuator 18 through the first frame 6 occurs less frequently. Therefore, it is possible to provide a semiconductor device (scanner) having a relatively simple structure, high controllability, and high performance.

The second actuator 4 and the first frame 6 are connected to each other by the third connection member 12. The second actuator 4 and the first frame 6 are connected to each other by the fourth connection member 14 at a position different from the position at which the third connection member 12 connects the second actuator 4 and the first frame 6 to each other. Therefore, heat generated from the second actuator 4 is more evenly held by the first frame 6 in comparison to a case where the first actuator 2 and the first frame 6 are connected to each other at one position. As a result, a situation in which extra heat is transferred into the third actuator 16 and the fourth actuator 18 through the first frame 6 occurs less frequently. Therefore, it is possible to provide a semiconductor device (scanner) having a relatively simple structure, high controllability, and high performance.

The third actuator 16 and the stage 20 are connected to each other by the fifth connection member 22. The third actuator 16 and the stage 20 are connected to each other by the sixth connection member 24 at a position different from the position at which the fifth connection member 22 connects the third actuator 16 and the stage 20 to each other. Thus, it is easy to more evenly transfer heat generated from the third actuator 16 into the stage 20. Therefore, a situation in which extra heat is transferred into the first actuator 2 and the second actuator 4 through the first frame 6 occurs less frequently in comparison to a case where the third actuator 16 and the stage 20 are connected at one position. Therefore, it is possible to provide a semiconductor device (scanner) having a relatively simple structure and high controllability.

The fourth actuator 18 and the stage 20 are connected to each other by the seventh connection member 26. The fourth actuator 18 and the stage 20 are connected to each other by the eighth connection member 28 at a position different from the position at which the seventh connection member 26 connects the fourth actuator 18 and the stage 20 to each other. Thus, it is easy to more evenly transfer heat generated from the fourth actuator 18 into the stage 20. Therefore, a situation in which extra heat is transferred into the first actuator 2 and the second actuator 4 through the first frame 6 occurs less frequently in comparison to a case where the third actuator 16 and the stage 20 are connected at one position. Therefore, it is possible to provide a semiconductor device (scanner) having a relatively simple structure and high controllability.

The thirteenth connection member 96 is provided in the vicinity of the middle of one end and the other end of the first actuator 2, to be adjacent to the first actuator 2. Thus, it is easy to cause an amount of heat applied to the fifth actuator 34 being dissipated to the thirteenth connection member 96 to be equal to the amount of heat applied to the sixth actuator 36 being dissipated to the thirteenth connection member 96. Therefore, it is easy to cause a distance of the stage 20 pivoting by the heat applied to the fifth actuator 34 to be equal to a distance of the stage 20 pivoting by the heat applied to the sixth actuator 36. As a result, it is possible to provide a semiconductor device (scanner) having a relatively simple structure, high controllability, and high performance.

The fourteenth connection member 98 is provided in the vicinity of the middle of one end and the other end of the second actuator 4, to be adjacent to the second actuator 4. Thus, it is easy to cause an amount of heat applied to the seventh actuator 38 being dissipated to the fourteenth connection member 98 to be equal to the amount of heat applied to the eighth actuator 40 being dissipated to the fourteenth connection member 98. Therefore, it is easy to cause a distance of the stage 20 pivoting by the heat applied to the seventh actuator 38 to be equal to a distance of the stage 20 pivoting by the heat applied to the eighth actuator 40. As a result, it is possible to provide a semiconductor device (scanner) having a relatively simple structure, high controllability, and high performance.

The ninth connection member 30 is provided in the vicinity of the middle of one end and the other end of the third actuator 16, to be adjacent to the third actuator 16, and connects the third actuator 16 and the first frame 6 to each other. Therefore, it is possible to secure both a distance of the first connection member 8, the first frame 6, and the ninth connection member 30 moving when heat of the first actuator 2 is transferred into the third actuator 16 and a distance of the third connection member 12, the first frame 6, and the ninth connection member 30 moving when heat of the second actuator 4 is transferred into the third actuator 16, to be long. Thus, a situation in which heat generated in the first actuator 2 and the second actuator 4 is transferred into the third actuator 16 occurs less frequently. Accordingly, it is possible to provide a semiconductor device (scanner) having a relatively simple structure and high controllability.

The tenth connection member 32 is provided in the vicinity of the middle of one end and the other end of the fourth actuator 18, to be adjacent to the fourth actuator 18, and connects the fourth actuator 18 and the first frame 6 to each other. Therefore, it is possible to secure both a distance of the second connection member 10, the first frame 6, and the tenth connection member 32 moving when heat from the first actuator 2 is transferred into the fourth actuator 18 and a distance of the fourth connection member 14, the first frame 6, and the tenth connection member 32 moving when heat from the second actuator 4 is transferred into the fourth actuator 18, to be long. Thus, a situation in which heat generated in the first actuator 2 and the second actuator 4 is transferred into the fourth actuator 18 occurs less frequently. Accordingly, it is possible to provide a semiconductor device (scanner) having a relatively simple structure and high controllability.

In a case where the first connection member 8 connects the one end of the first actuator 2 to the first frame 6, and the second connection member 10 connects the other end of the first actuator 2 to the first frame 6, in other words, in a case where the ends of the actuator are connected to the first frame 6, it is possible to increase a range of the stage 20 deforming by the first actuator 2.

In a case where the third connection member 12 connects the one end of the second actuator 4 to the first frame 6, and the fourth connection member 14 connects the other end of the second actuator 4 to the first frame 6, in other words, in a case where the ends of the actuator are connected to the first frame 6, it is possible to increase a range of the stage 20 deforming by the second actuator 4.

In a case where the fifth connection member 22 connects the one end of the third actuator 16 to the stage 20, and the sixth connection member 24 connects the other end of the third actuator 16 to the stage 20, in other words, in a case where the ends of the actuator are connected to the stage 20, it is possible to increase a range of the stage 20 deforming by the third actuator 16.

In a case where the seventh connection member 26 connects the one end of the fourth actuator 18 to the stage 20, and the eighth connection member 28 connects the other end of the fourth actuator 18 to the stage 20, in other words, in a case where the ends of the actuator are connected to the stage 20, it is possible to increase a range of the stage 20 deforming by the fourth actuator 18.

Preferably, the first connection member 8 and the second connection member 10 are provided to be symmetrical with each other with respect to an axis which is set to the plane parallel to the yz plane passing through the center of the thirteenth connection member 96. This is because heat transferred from the fifth actuator 34 into the first frame 6 through the first connection member 8 and a speed at which the heat is transferred are caused to be equal to heat transferred from the sixth actuator 36 into the first frame 6 through the second connection member 10 and a speed at which the heat is transferred, respectively.

Preferably, the third connection member 12 and the fourth connection member 14 are provided to be symmetrical with each other with respect to an axis set to the plane parallel to the yz plane passing through the center of the fourteenth connection member 98. This is because heat transferred from the seventh actuator 38 into the first frame 6 through the third connection member 12 and a speed at which the heat is transferred are caused to be equal to heat transferred from the eighth actuator 40 into the first frame 6 through the fourth connection member 14 and a speed at which the heat is transferred, respectively.

Preferably, the fifth connection member 22 and the sixth connection member 24 are provided to be symmetrical with each other with respect to an axis set to the plane parallel to the xz plane passing through the center of the ninth connection member 30. This is because heat transferred from the ninth actuator 42 into the stage 20 through the fifth connection member 22 and a speed at which the heat is transferred are caused to be equal to heat transferred from the tenth actuator 44 into the stage 20 through the sixth connection member 24 and a speed at which the heat is transferred, respectively.

Preferably, the seventh connection member 26 and the eighth connection member 28 are provided to be symmetrical with each other with respect to an axis set to the plane parallel to the xz plane passing through the center of the tenth connection member 32. This is because heat transferred from the eleventh actuator 46 into the stage 20 through the seventh connection member 26 and a speed at which the heat is transferred are caused to be equal to heat transferred from the twelfth actuator 48 into the stage 20 through the seventh connection member 26 and a speed at which the heat is transferred, respectively.

Each of the first actuator 2, the second actuator 4, the third actuator 16, and the fourth actuator 18 includes the first oxide layer 60 and the first metal layer 64 sequentially stacked in the z-direction. A function as the actuator is obtained with a simple structure by expansion and contraction occurring by heat of the first metal layer 64.

Each of the connection members (first connection member 8, second connection member 10, third connection member 12, fourth connection member 14, fifth connection member 22, sixth connection member 24, seventh connection member 26, eighth connection member 28, ninth connection member 30, and tenth connection member 32), the first frame 6, the stage 20, the thirteenth connection member 96, and the fourteenth connection member 98 includes the second oxide layer 62, the second metal layer 66, and the third oxide layer 68 sequentially stacked in the z-direction. Since expansion and contraction by heat of the second metal layer 66 are suppressed by the second oxide layer 62 and the third oxide layer 68, a structural body which has a simple structure and is thermally stable is obtained.

Figure 5A:
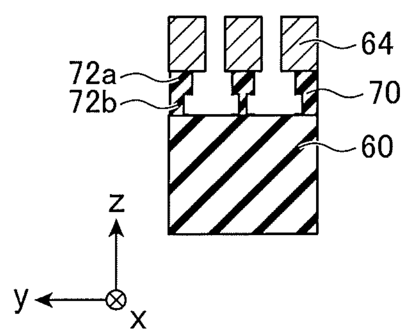
FIGS. 5A and 5B are schematic diagrams illustrating an example of a section of the actuator in the semiconductor device in the first embodiment.
Figure 5B:
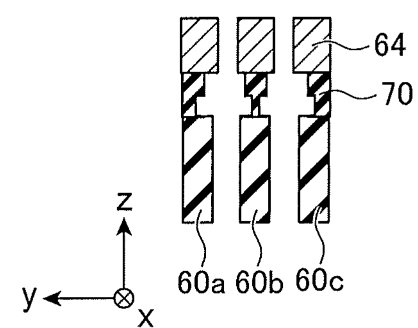

FIGS. 5A and 5B are schematic diagrams illustrating an example of the section of the actuator in the semiconductor device 100 in the embodiment. FIG. 5A illustrates an example of the section of the actuator in the embodiment. FIG. 5B illustrates an example of a section of an actuator in a comparative form.

The first oxide layer 60 may be integrally formed as illustrated in FIG. 5A rather than a case where the first oxide layer 60 is separated into oxide layers 60*a*, 60*b*, and 60*c* as illustrated in FIG. 5B. In a case of FIG. 5B, if the oxide layers 60*a*, 60*b*, and 60*c* are individually pressed in the z-direction by the first metal layer 64, a distance of each of the oxide layers 60*a*, 60*b*, and 60*c* moving in the z-direction may vary. Thus, it is difficult to obtain a stable travel distance. On the contrary, as in FIG. 5A, if the first oxide layer 60 is integrated, the entirety of the first oxide layer 60 is more stably pressed in the z-direction.

In order to obtain the integrated first oxide layer 60 as in FIG. 5A, as illustrated in FIG. 3C, it is preferable that the stopper 88 is provided, and the stopper 88 and the oxide layer 80 of the substrate 90 are set not to be removed. Thus, after the stopper 88 is removed, the fourth oxide layer 70 having a width narrower than the first oxide layer 60 is provided. The first portion 72*a* and the second portion 72*b* which is provided between the first portion 72*a* and the first oxide layer 60 and has a width narrower than the first portion 72*a* are provided in the fourth oxide layer 70.

Since the first actuator 2 includes the fifth actuator 34 and the sixth actuator 36 provided to be adjacent to each other in the x-direction, it is possible to perform independent control, for example, for the operation of the stage 20, on the upper half side of the stage 20 and on the lower half side of the stage 20 in the drawings. Therefore, it is possible to control the stage 20 with higher precision.

Even though the second actuator 4 includes the seventh actuator 38 and the eighth actuator 40 provided to be adjacent to each other in the x-direction, the third actuator 16 includes the ninth actuator 42 and the tenth actuator 44 provided to be adjacent to each other in the y-direction, and the fourth actuator 18 includes the eleventh actuator 46 and the twelfth actuator 48 provided to be adjacent to each other in the y-direction, similar effects are obtained.

The first metal layer 64 and the second metal layer 66 particularly contain Al, and thus, processing is easy and a high thermal expansion coefficient is obtained. Accordingly, this is preferable.

FIGS. 4A to 4D are schematic diagrams illustrating a semiconductor device in a comparison form of the embodiment.

Figure 4A:
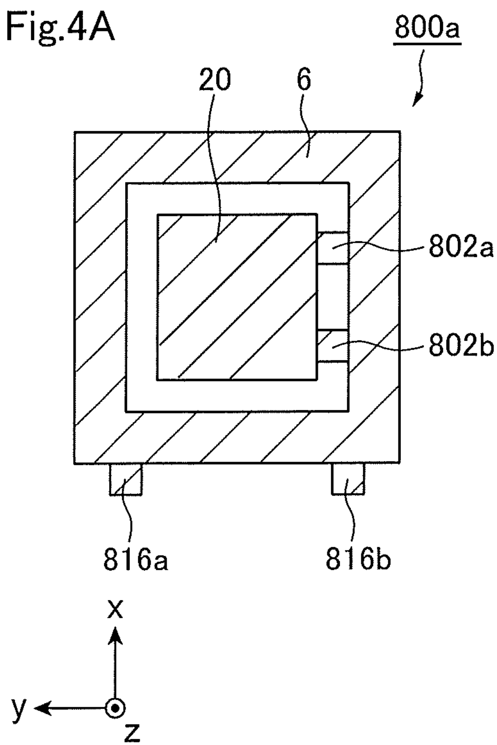
FIGS. 4A to 4D are schematic diagrams illustrating a semiconductor device as a comparison form of the first embodiment.

A semiconductor device 800*a* illustrated in FIG. 4A includes actuators 816*a* and 816*b* on the lower side of the first frame 6 in FIG. 4A. A stage 20 and actuators 802*a* and 802*b* are provided in the first frame 6. Here, the actuators 802*a* and 802*b* are provided on the right side of the first frame 6 in FIG. 4A. The stage 20 pivots on the y-axis by the actuators 816*a* and 816*b*. The stage 20 pivots on the x-axis by the actuators 802*a* and 802*b*.

However, for example, in a case of applying heat to the actuator 816*b*, the heat is transferred into the actuator 802*b* through the first frame 6. Therefore, if the semiconductor device 800*a* is set to drive around the y-axis, the semiconductor device 800*a* also drives around the x-axis. Thus, there is a problem that an optical axis is shifted in an unintended direction.

Figure 4B:
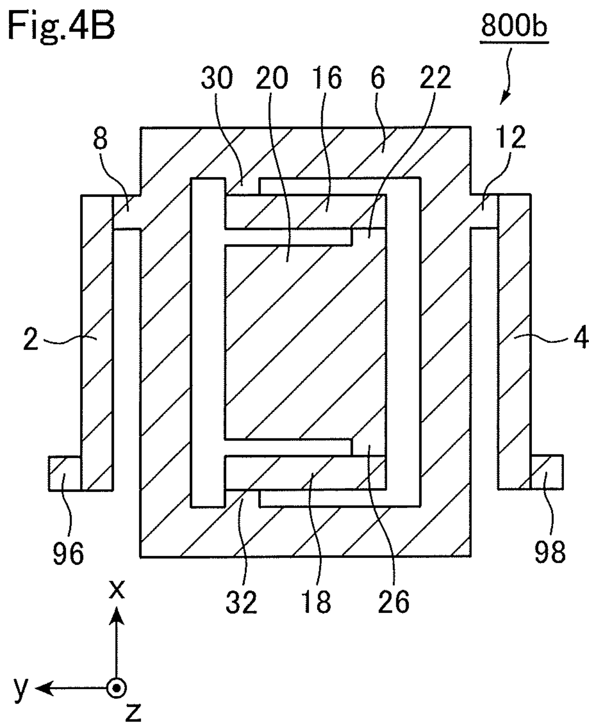

In a semiconductor device 800*b* illustrated in FIG. 4B, the first frame 6 is interposed between the first actuator 2 and the second actuator 4. The first actuator 2 and the second actuator 4 are connected to the first frame 6 by the first connection member 8 and the third connection member 12. The third actuator 16 and the fourth actuator 18 are provided between the first frame 6 and the stage 20. The third actuator 16 is connected to the first frame 6 by the ninth connection member 30 and is connected to the stage 20 by the fifth connection member 22. The fourth actuator 18 is connected to the first frame 6 by the tenth connection member 32 and is connected to the stage 20 by the seventh connection member 26. The stage 20 drives around the y-axis by the first actuator 2 and the second actuator 4. The stage 20 drives around the x-axis by the third actuator 16 and the fourth actuator 18.

In the semiconductor device 800*b*, the first frame 6 is provided. Thus, heat separation between heat applied to the actuator for driving around the x-axis and heat applied to the actuator for driving around the y-axis is performed well, and it is possible to reduce the shift of the optical axis as shown in the semiconductor device 800*a*. However, for example, in FIG. 4B, the first connection member 8 and the third connection member 12 are provided on the upper side of FIG. 4B. Therefore, the heat applied to the first actuator 2 and the second actuator 4 is hardly conducted to the fourth actuator 18, but is conducted to the third actuator 16 well through the first frame 6 and the ninth connection member 30. Thus, there is a problem that the movement of the semiconductor device (scanner) becomes an asymmetric movement.

Figure 4C:
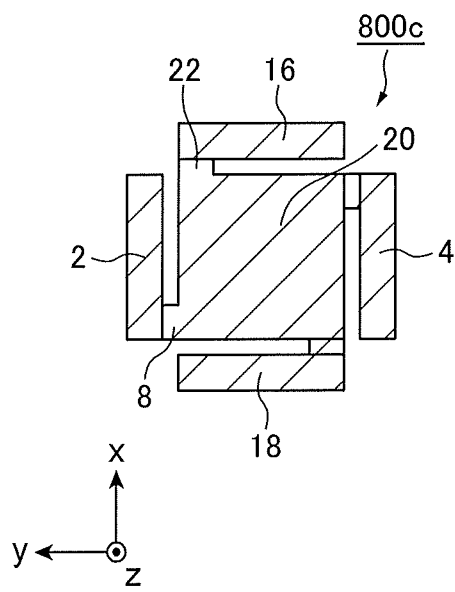
Figure 4D:
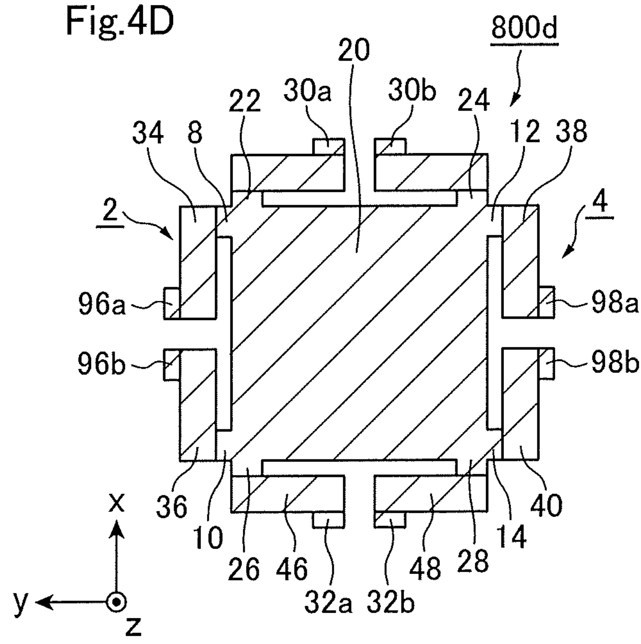

Further, as with a semiconductor device 800*c* illustrated in FIG. 4C and a semiconductor device 800*d* Illustrated in FIG. 4D, a semiconductor device without the first frame 6 has a problem that heat conduction in the semiconductor device or the movement of the actuator by the heat conduction becomes complicated, and control as the semiconductor device (scanner) has difficulty.

According to the semiconductor device in the embodiment, it is possible to provide a high-performance semiconductor device.

Second Embodiment

A semiconductor device 110 according to a second embodiment is different from the semiconductor device 100 in the first embodiment in that a second frame 50 is further provided on the inside of a first frame 6, and an eleventh connection member 52 and a twelfth connection member 54 connecting the first frame 6 and the second frame 50 to each other are provided. Here, repetitive descriptions of the same points as points in the first embodiment will be omitted.

Figure 6:
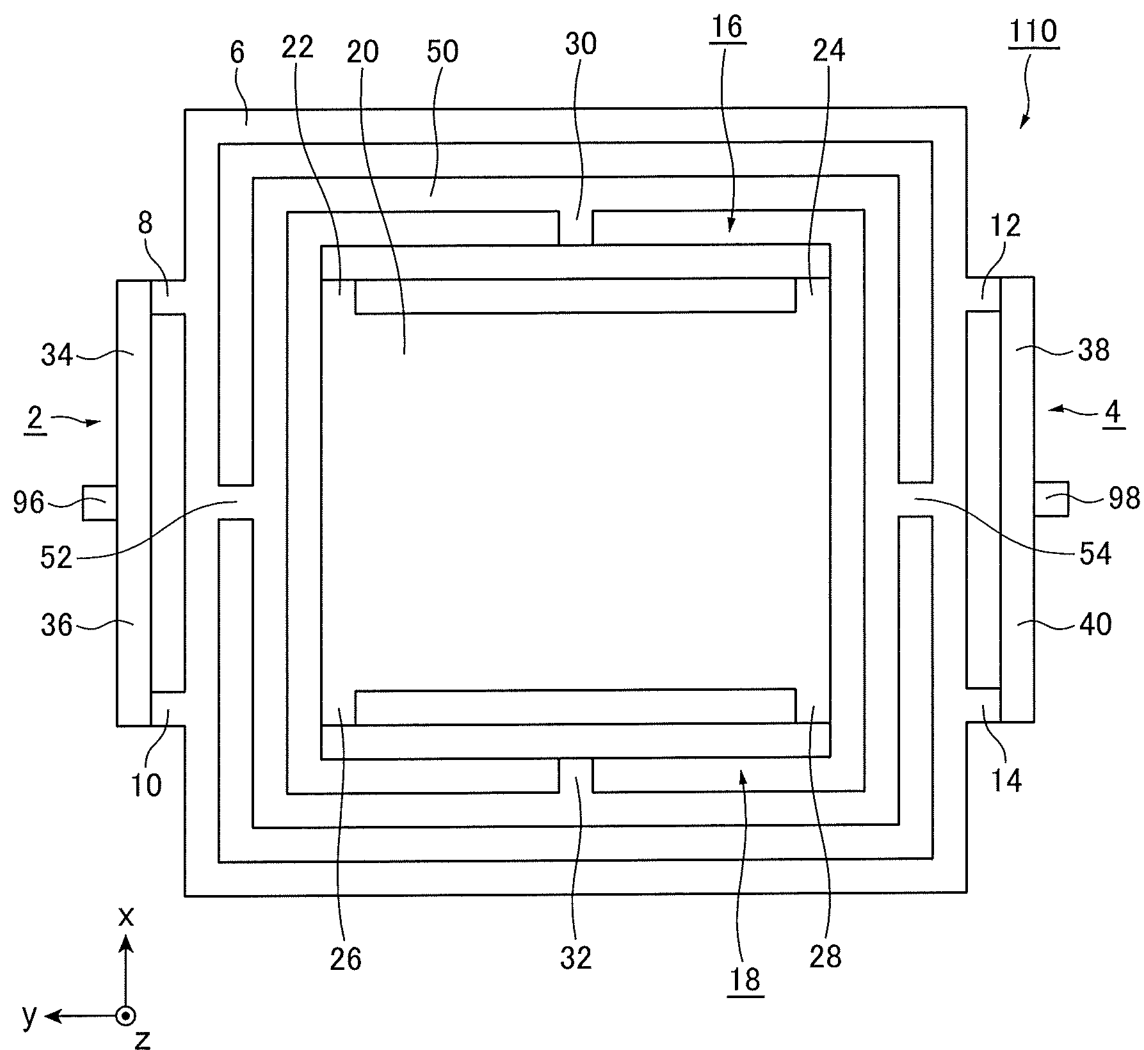
FIG. 6 is a schematic diagram illustrating a semiconductor device according to a second embodiment.

FIG. 6 is a schematic diagram illustrating the semiconductor device 110 in the embodiment.

For example, the second frame 50 is preferably provided parallel to a plane including the x-direction and the y-direction because of a simple structure. Since the second frame 50 is further provided, thermal separation between heat applied to the actuator for driving around the x-axis and heat applied to the actuator for driving around the y-axis is performed further better.

In a case where the eleventh connection member 52 is provided in the vicinity of the middle of one end and the other end of a first actuator 2, to be adjacent to the first actuator 2, balance of heat which is generated from the first actuator 2 and is transferred into the second frame 50 through the first frame 6 is favorable. Thus, the heat is more evenly transferred into the second frame 50. Therefore, separation between heat generation in the first actuator 2 and heat generation in the third actuator 16 and the fourth actuator 18, which occurs by providing the first frame 6 and the second frame 50 is more accelerated.

In a case where the twelfth connection member 54 is provided in the vicinity of the middle of one end and the other end of a second actuator 4, to be adjacent to the second actuator 4, balance of heat which is generated from the second actuator 4 and is transferred into the second frame 50 through the first frame 6 is favorable. Thus, the heat is more evenly transferred into the second frame 50. Therefore, separation between heat generation in the second actuator 4 and heat generation in the third actuator 16 and the fourth actuator 18, which occurs by providing the first frame 6 and the second frame 50 is more accelerated.

According to the semiconductor device in the embodiment, it is possible to provide a high-performance semiconductor device.

Third Embodiment

A semiconductor device according to a third embodiment is different from the semiconductor devices in the first and second embodiments in that first to fourth actuators are piezoelectric actuators. Here, repetitive descriptions of the same points as points of the semiconductor device in the first and second embodiments will be omitted.

Figure 7A:
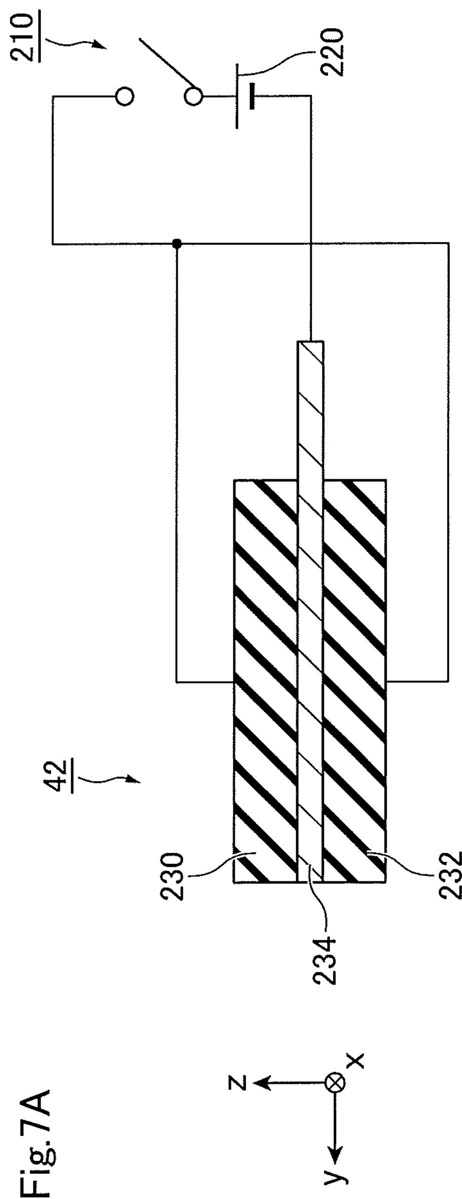
FIGS. 7A and 7B are schematic diagram illustrating an example of an operation of a piezoelectric actuator in a semiconductor device according to a third embodiment.
Figure 7B:
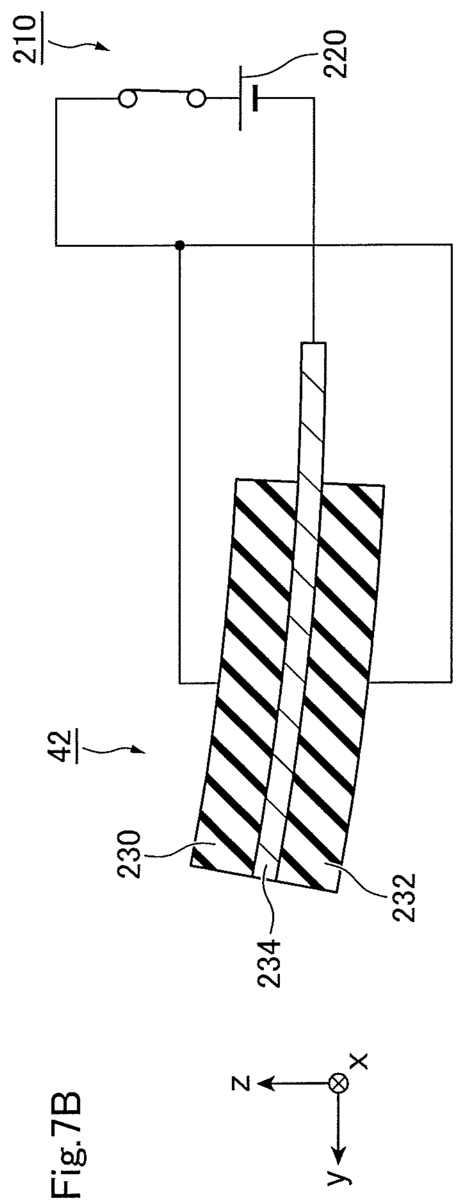

FIGS. 7A and 7B are schematic diagram illustrating an example of an operation of the semiconductor device in the embodiment, in a case where a ninth actuator 42 is a piezoelectric actuator. In the embodiment, the actuator includes a conductive plate 234, a first piezoelectric material 230, and a second piezoelectric material 232. The first piezoelectric material 230, and the second piezoelectric material 232 are provided to interpose the conductive plate 234. FIG. 7A illustrates a state where a switch 210 is in an off state. If the switch 210 turns into an on state, as in FIG. 7B, electric fields are applied to the first piezoelectric material 230 and the second piezoelectric material 232 from a power source 220. Here, a direction of the electric field applied to the first piezoelectric material 230 is opposite to a direction of the electric field applied to the second piezoelectric material 232. Therefore, the entirety of the first piezoelectric material 230 and the second piezoelectric material 232 bends as illustrated in FIG. 7B.

Even though the first to fourth actuators are piezoelectric actuators, it is possible to provide a high-performance semiconductor device because two-axis control is possible with a simple structure.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:

a first actuator;

a second actuator;

a first frame provided between the first actuator and the second actuator;

a first connection member connecting the first actuator and the first frame to each other;

a second connection member connecting the first actuator and the first frame to each other at a position different from a position at which the first connection member connects the first actuator and the first frame to each other;

a third connection member connecting the second actuator and the first frame to each other;

a fourth connection member connecting the second actuator and the first frame to each other at a position different from a position at which the third connection member connects the second actuator and the first frame to each other;

a third actuator provided on an inside of the first frame;

a fourth actuator provided on the inside of the first frame;

a stage provided between the third actuator and the fourth actuator;

a fifth connection member connecting the third actuator and the stage to each other;

a sixth connection member connecting the third actuator and the stage to each other at a position different from a position at which the fifth connection member connects the third actuator and the stage to each other;

a seventh connection member connecting the fourth actuator and the stage to each other;

an eighth connection member connecting the fourth actuator and the stage to each other at a position different from a position at which the seventh connection member connects the fourth actuator and the stage to each other;

a ninth connection member connecting the third actuator and the first frame to each other; and a tenth connection member connecting the fourth actuator and the first frame to each other.

2. A semiconductor device comprising:

a first actuator;

a second actuator;

a first frame provided between the first actuator and the second actuator;

a first connection member connecting the first actuator and the first frame to each other;

a second connection member connecting the first actuator and the first frame to each other at a position different from a position at which the first connection member connects the first actuator and the first frame to each other;

a third connection member connecting the second actuator and the first frame to each other;

a fourth connection member connecting the second actuator and the first frame to each other at a position different from a position at which the third connection member connects the second actuator and the first frame to each other;

a second frame provided on an inside of the first frame;

a third actuator provided on an inside of the second frame;

a fourth actuator provided on the inside of the second frame;

a stage provided between the third actuator and the fourth actuator;

a fifth connection member connecting the third actuator and the stage to each other;

a sixth connection member connecting the third actuator and the stage to each other at a position different from a position at which the fifth connection member connects the third actuator and the stage to each other;

a seventh connection member connecting the fourth actuator and the stage to each other;

an eighth connection member connecting the fourth actuator and the stage to each other at a position different from a position at which the seventh connection member connects the fourth actuator and the stage to each other;

a ninth connection member connecting the third actuator and the second frame to each other;

a tenth connection member connecting the fourth actuator and the second frame to each other;

an eleventh connection member provided between the first frame and the second frame and between the first actuator and the second frame, the eleventh connection member connecting the first frame and the second frame to each other; and a twelfth connection member provided between the first frame and the second frame and between the second actuator and the second frame, the twelfth connection member connecting the first frame and the second frame to each other.

3. The semiconductor device according to claim 2, wherein the eleventh connection member is provided to be adjacent to a vicinity of a middle of an one end and another end of the first actuator, and the twelfth connection member is provided to be adjacent to a vicinity of a middle of an one end and another end of the second actuator.

4. The semiconductor device according to claim 2, wherein the first actuator has a rectangular shape and has a long side provided parallel to a first direction, the second actuator has a rectangular shape and has a long side provided parallel to the first direction, the third actuator has a rectangular shape and has a long side provided parallel to a second direction intersecting the first direction, and the fourth actuator has a rectangular shape and has a long side provided parallel to the second direction.

5. The semiconductor device according to claim 4, wherein the first actuator includes a fifth actuator and a sixth actuator provided to be adjacent to each other in the first direction, the second actuator includes a seventh actuator and an eighth actuator provided to be adjacent to each other in the first direction, the third actuator includes a ninth actuator and a tenth actuator provided to be adjacent to each other in the second direction, and the fourth actuator includes an eleventh actuator and a twelfth actuator provided to be adjacent to each other in the second direction.

6. The semiconductor device according to claim 4, wherein the first frame is provided parallel to a plane including the first direction and the second direction.

7. The semiconductor device according to claim 2, further comprising:

a thirteenth connection member connected to the first actuator; and a fourteenth connection member connected to the second actuator, wherein the first connection member and the second connection member are provided to be symmetrical with each other with respect to the thirteenth connection member, the third connection member and the fourth connection member are provided to be symmetrical with each other with respect to the fourteenth connection member, the fifth connection member and the sixth connection member are provided to be symmetrical with each other with respect to the ninth connection member, and the seventh connection member and the eighth connection member are provided to be symmetrical with each other with respect to the tenth connection member.

8. The semiconductor device according to claim 2, wherein the first connection member connects one end of the first actuator to the first frame, the second connection member connects another end of the first actuator to the first frame, the third connection member connects one end of the second actuator to the first frame, the fourth connection member connects another end of the second actuator to the first frame, the fifth connection member connects one end of the third actuator to the stage, the sixth connection member connects another end of the third actuator to the stage, the seventh connection member connects one end of the fourth actuator to the stage, and the eighth connection member connects another end of the fourth actuator to the stage.

9. The semiconductor device according to claim 2, wherein the ninth connection member is provided to be adjacent to a vicinity of a middle of one end and another end of the third actuator, and the tenth connection member is provided to be adjacent to a vicinity of a middle of one end and another end of the fourth actuator.

10. The semiconductor device according to claim 4, wherein the first actuator, the second actuator, the third actuator, or the fourth actuator includes a first oxide layer and a first metal layer sequentially stacked in a third direction intersecting the first direction and the second direction, and the first frame or the stage includes a second oxide layer, a second metal layer, and a third oxide layer sequentially stacked in the third direction.

11. The semiconductor device according to claim 10, wherein the first metal layer and the second metal layer contain aluminum.

12. The semiconductor device according to claim 10, wherein the first actuator, the second actuator, the third actuator, or the fourth actuator further includes a fourth oxide layer provided between the first oxide layer and the first metal layer, the fourth oxide layer having a width narrower than a width of the first oxide layer in the first direction or the second direction.

13. The semiconductor device according to claim 12, wherein the fourth oxide layer includes a first portion and a second portion provided between the first portion and the first metal layer, the second portion having a width narrower than a width of the first portion in the first direction or the second direction.

14. The semiconductor device according to claim 2, wherein the first actuator, the second actuator, the third actuator, and the fourth actuator are piezoelectric actuators.

15. The semiconductor device according to claim 2, further comprising:

a light reflector provided in the stage.

16. A semiconductor device comprising:

a first actuator;

a second actuator;

a first frame provided between the first actuator and the second actuator;

a second frame provided on an inside of the first frame;

a third actuator provided on an inside of the second frame;

a fourth actuator provided on the inside of the second frame;

a stage provided between the third actuator and the fourth actuator, wherein the stage pivots by heat generated from the first actuator, the second actuator, the third actuator, or the fourth actuator, and a portion of the generated heat is transferred into the first frame.

17. The semiconductor device according to claim 16, wherein the portion of the generated heat, which has been transferred into the first frame is transferred into the first actuator, the second actuator, the third actuator, the fourth actuator, or the second frame, in which the heat is not generated.

* * * * *